United States Patent
Li et al.

(10) Patent No.: US 11,386,961 B2
(45) Date of Patent: Jul. 12, 2022

(54) CENTRALIZED FIXED RATE SERIALIZER AND DESERIALIZER FOR BAD COLUMN MANAGEMENT IN NON-VOLATILE MEMORY

(71) Applicant: SanDisk Technologies LLC, Addison, TX (US)

(72) Inventors: YenLung Li, San Jose, CA (US); Chen Chen, Mountain View, CA (US); Min Peng, San Jose, CA (US); Mitsuyuki Watanabe, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 96 days.

(21) Appl. No.: 16/722,538

(22) Filed: Dec. 20, 2019

(65) Prior Publication Data

US 2021/0193226 A1 Jun. 24, 2021

(51) Int. Cl.
*G06F 3/00* (2006.01)
*G11C 16/10* (2006.01)
*G06F 13/16* (2006.01)
*G11C 16/26* (2006.01)
*G11C 16/04* (2006.01)
*H03M 9/00* (2006.01)

(52) U.S. Cl.
CPC ......... *G11C 16/10* (2013.01); *G06F 13/1668* (2013.01); *G11C 16/0483* (2013.01); *G11C 16/26* (2013.01); *H03M 9/00* (2013.01)

(58) Field of Classification Search
CPC ..... G06F 13/00; G06F 13/1668; G11C 16/10; G11C 16/0483; G11C 16/26; H03M 9/00
See application file for complete search history.

(56) References Cited

U.S. PATENT DOCUMENTS

| | | | | |
|---|---|---|---|---|
| 6,166,990 | A * | 12/2000 | Ooishi | G11C 7/22 365/194 |
| 6,732,229 | B1 * | 5/2004 | Leung | G11C 29/78 365/200 |
| 9,076,506 | B2 * | 7/2015 | Tsai | G11C 19/00 |
| 9,490,035 | B2 * | 11/2016 | Tsai | G11C 16/0483 |
| 10,825,526 | B1 * | 11/2020 | Li | G11C 11/5671 |
| 10,971,202 | B1 * | 4/2021 | Chen | G11C 16/0483 |
| 2003/0031076 | A1 * | 2/2003 | Widmer | G11C 16/08 365/230.03 |

(Continued)

*Primary Examiner* — Henry Tsai
*Assistant Examiner* — Kim T Huynh
(74) *Attorney, Agent, or Firm* — Vierra Magen Marcus LLP

(57) ABSTRACT

In a non-volatile memory circuit, performance is improved by converting data between a serial format, for transfer on and off of the memory circuit, and a parallel format, for transfer to and from the memory latches used for read and writing data into the memory array of the memory circuit. The memory array is split into M+N divisions, but transferred with a degree of parallelism of M, allowing M words of data to be transferred in parallel at a fixed transfer rate while allowing for up to N bad columns in a transfer. In the write path, a column skipping mechanism is used when converting words of write data into a parallel format. In the read path, a set of (M+N) to 1 multiplexers is used to align the word of read data so that read data can be transferred at a fixed rate and without any added latency.

15 Claims, 14 Drawing Sheets

(56) References Cited

U.S. PATENT DOCUMENTS

| | | | |
|---|---|---|---|
| 2004/0032767 A1* | 2/2004 | Noichi | G11C 16/10 |
| | | | 365/200 |
| 2004/0179412 A1* | 9/2004 | Lehmann | G11C 29/812 |
| | | | 365/200 |
| 2005/0101236 A1* | 5/2005 | Wang | G11C 16/12 |
| | | | 451/538 |
| 2005/0185497 A1* | 8/2005 | Ikeda | G11C 11/408 |
| | | | 365/230.06 |
| 2010/0329007 A1* | 12/2010 | Chibvongodze | G11C 19/00 |
| | | | 365/185.05 |
| 2014/0126293 A1* | 5/2014 | Tsai | G11C 16/10 |
| | | | 365/185.18 |
| 2016/0371033 A1* | 12/2016 | La Fratta | G11C 7/1006 |
| 2019/0057746 A1* | 2/2019 | Komai | G11C 5/025 |
| 2021/0193226 A1* | 6/2021 | Li | G11C 16/0483 |

\* cited by examiner

CENTRALIZED FIXED RATE SERIALIZER AND DESERIALIZER FOR BAD COLUMN MANAGEMENT IN NON-VOLATILE MEMORY

BACKGROUND

The present disclosure relates to technology for non-volatile data storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories. Typically, the memory device has a memory controller and one or more memory packages. The memory package has one or more logical units. As one example, each logical unit can be a separate integrated circuit, or memory "die." Each memory die contains non-volatile storage elements (e.g., non-volatile memory cells), as well as read and write circuitry. The memory package also contains addressing circuitry in order to properly address the memory cells. As one example, the memory package includes NAND flash memory. However, memory packages other than NAND flash are known.

The read and write circuitry on a memory die includes a number of latches to buffer data being read out of and programmed into the array of memory cells on the die. The number of such latches is related to the number of memory cells sensed concurrently, the format of the data (the number of data states stored in a cell), and other factors. The rate at which data can be transferred between the latches and the memory cells can be a limiting factor for how quickly data can be transferred on and off of a memory die. To improve performance, data that is received at and transferred from a memory die serially (such as in a word-wide serial transfer) at a high data rate that can be slowed down on the die by conversion to a parallel format to relax the timing requirements at the data latches. As transfer rates increase, there is an on-going search to improve the efficiency of this serialization/deserialization process used in the conversion between serial and parallel formats.

DETAILED DESCRIPTION

One measure of the performance of a memory circuit is rate at which data can be transferred onto and off of the memory die. Performance can be increased by increasing the clock rate for the bus connected to the input/output interface of the memory die. Once on the memory die, the memory circuit needs to be able to read and write data at this rate. In order to relax the timing requirements for the data latches that store the data to be written to or that has been read from a memory array, the write data coming on to the memory die in a serial format is converted to a parallel format for transfer to the data latches; and the read data being transferred out of the data latches in a parallel format is converted into a serial format for transfer off of the memory die. This provides for a more relaxed timing requirement for the read/write circuits and their data latches. To increase the level of parallelism, a memory array can be split up into a number of divisions, where the transfer operations related to each of the division can be performed in parallel.

A memory array can be organized as a series of columns, each of one or more bit lines, and word lines that span the memory array. Each of the divisions of the memory will have multiple columns and some of these columns can be defective. When transferring data to or from the columns, the defective columns need to be skipped, which can complicate the parallel transfers. For example, if a memory has five divisions, then data can be transferred with a degree of parallelism of five; except that if one or two of the columns are bad, then only four or three sets of data will be transferred in parallel rather than five. This can complicate both the serialization of write data, when data is converted from a parallel to a serial format, and the deserialization of read data, when data is converted from a serial to a parallel format.

The following presents a division of the memory array that is larger than the degree of parallelism, introducing an array with M+N divisions, where M is an integer greater than 1 and N is an integer greater than or equal to 1, but using a degree of parallelism M, so that for each parallel transfer up to N defective columns can be accommodated while using a fixed rate for the serialization and deserialization process. For example, if an array uses 7 divisions, but only transfer words of data with a degree of parallelism of five, up to two bad columns can be accommodated per transfer. In the serial in, parallel out flow for the write direction, a skip mechanism is used for bad columns. The parallel in, serial out flow of the read direction uses an M+N to M multiplexing to avoid bad columns. In addition to providing a fixed rate for the transfers in either direction, it also allows for transfer to begin with a selected column address without any cycles lost to latency.

Figure 1:
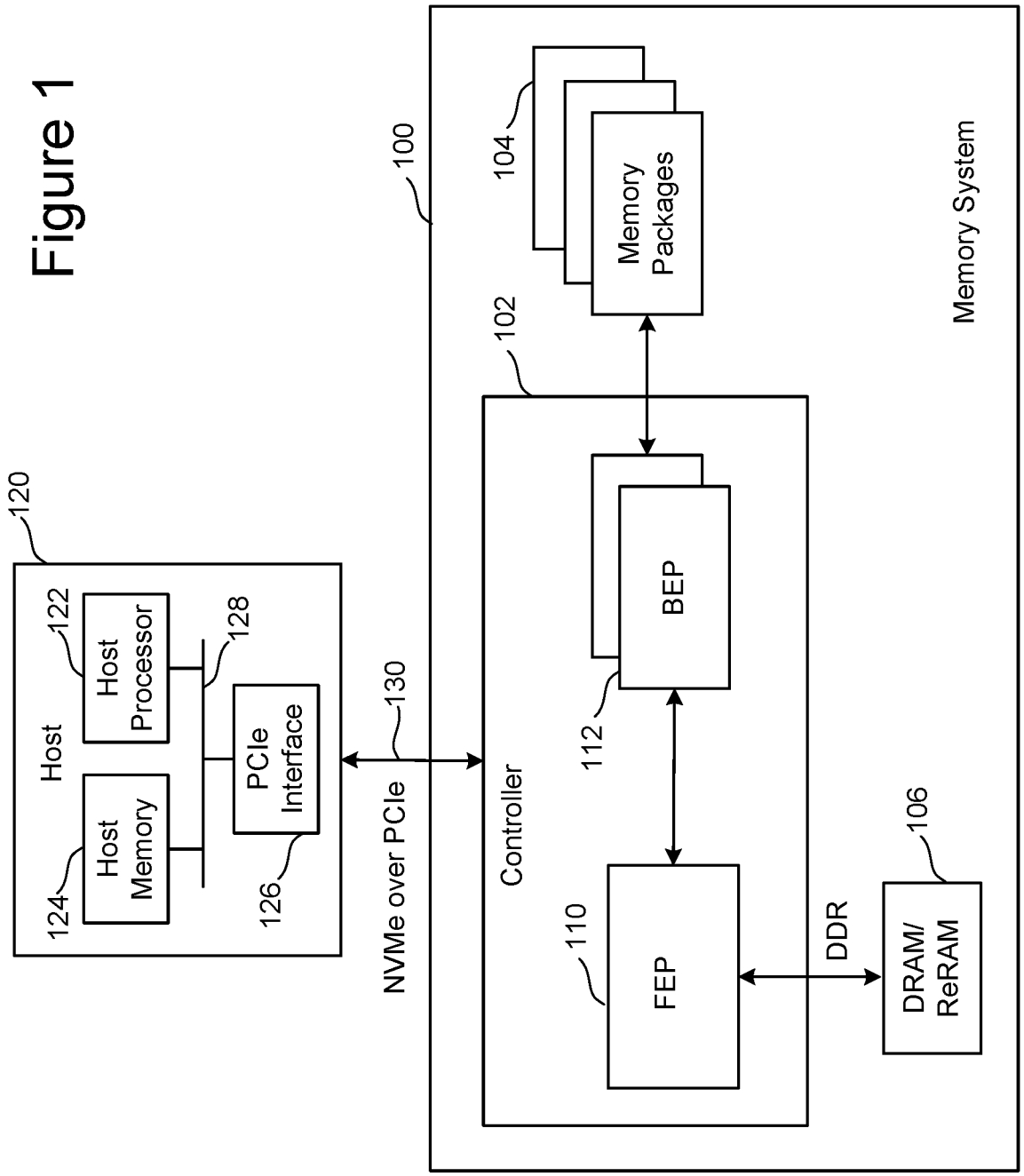
FIG. 1 is a block diagram of one embodiment of a memory system connected to a host.

FIG. 1 is a block diagram of one embodiment of a memory system 100 connected to a host 120. Memory system 100 can implement the technology proposed herein, where data are received from and transferred to the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
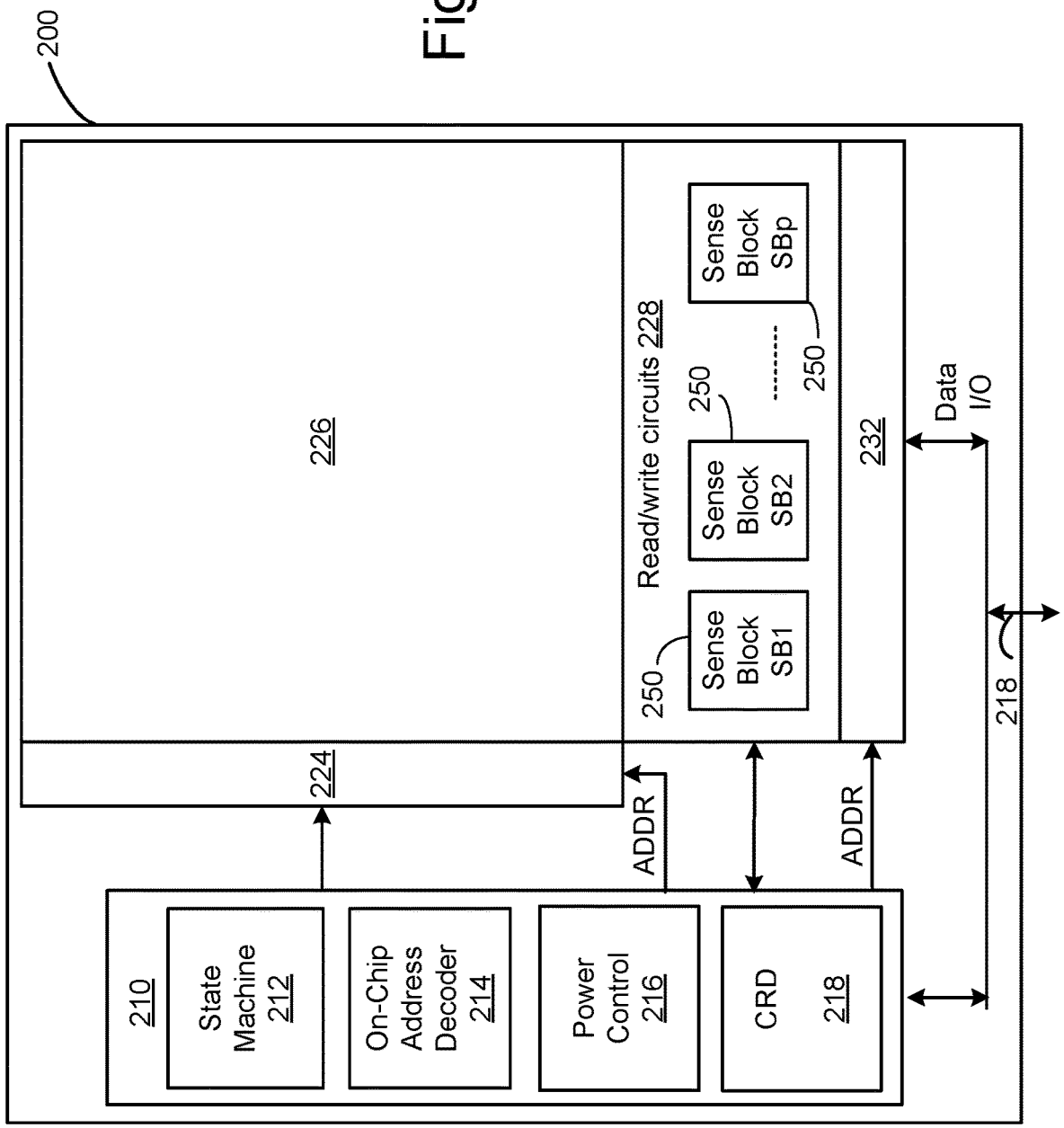
FIG. 2 is a block diagram of one embodiment of a memory die.

FIG. 2 is a functional block diagram of one embodiment of the integrated circuit of a memory die 200. The components depicted in FIG. 2 are electrical circuits. In one embodiment, each memory die 200 includes a memory structure 226, control circuitry 210, and read/write circuits 228. Memory structure 226 is addressable by word lines via a row decoder 224 and by bit lines via a column decoder 232. The read/write circuits 228 include multiple sense blocks 250 including SB1, SB2, . . . , SBp (sensing circuitry) and allow a page of memory cells to be read or programmed in parallel. Commands and data are transferred between the controller and the memory die 200 via lines 218. In one embodiment, memory die 200 includes a set of input and/or output (I/O) pins that connect to lines 218.

Control circuitry 210 cooperates with the read/write circuits 228 to perform memory operations (e.g., write, read, and others) on memory structure 226, and includes a state machine 212, an on-chip address decoder 214, and a power control circuit 216. State machine 212 provides die-level control of memory operations. In one embodiment, state machine 212 is programmable by software. In other embodiments, state machine 212 does not use software and is completely implemented in hardware (e.g., electrical circuits). In another embodiment, state machine 212 is replaced by a micro-controller. In one embodiment, control circuitry 210 includes buffers such as registers, ROM fuses and other storage devices for storing default values such as base voltages and other parameters.

The on-chip address decoder 214 provides an address interface between addresses used by controller 102 to the hardware address used by the decoders 224 and 232. Power control module 216 controls the power and voltages supplied to the word lines and bit lines during memory operations. Power control module 216 may include charge pumps for creating voltages. The sense blocks include bit line drivers.

The control circuitry can also maintain an inventory of bad columns, or column redundancy data (CRD) 218, that can include columns determined to be bad as part of an initial test process on the fresh device, columns determined to be bad during subsequent operation of the memory die, or both. This bad column information can be maintained in ROM memory or RAM memory on the memory die, for example. The used of the column redundancy information is discussed in more detail below with respect to serializer/deserializer circuit embodiments.

For purposes of this document, the phrase "one or more control circuits" refers to a controller, a state machine, a micro-controller and/or control circuitry 210, or other analogous circuits that are used to control non-volatile memory.

In one embodiment, memory structure 226 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 226 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 226 is not limited to the examples above. Many different types of memory array architectures or memory technologies can be used to form memory structure 226. No particular non-volatile memory technology is required for purposes of the new claimed embodiments proposed herein. Other examples of suitable technologies for memory cells of the memory structure 226 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three-dimensional arrays, cross-point arrays, stacked two dimensional arrays, vertical bit line arrays, and the like.

One example of a ReRAM is a cross point memory that includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

As noted above, the memory structure 226 is typically structured as an array of memory cells formed along word lines and bit lines, where the word lines are addressable via a row decoder 224 and bit lines are addressable via a column decoder 232. To sense the state of the memory cells, the bit lines are connected to the read/write circuits 228 that include the multiple sense blocks 250 including SB1, SB2, . . . , SBp (sensing circuitry), allowing a page of memory cells to be read or programmed in parallel.

Figure 3:
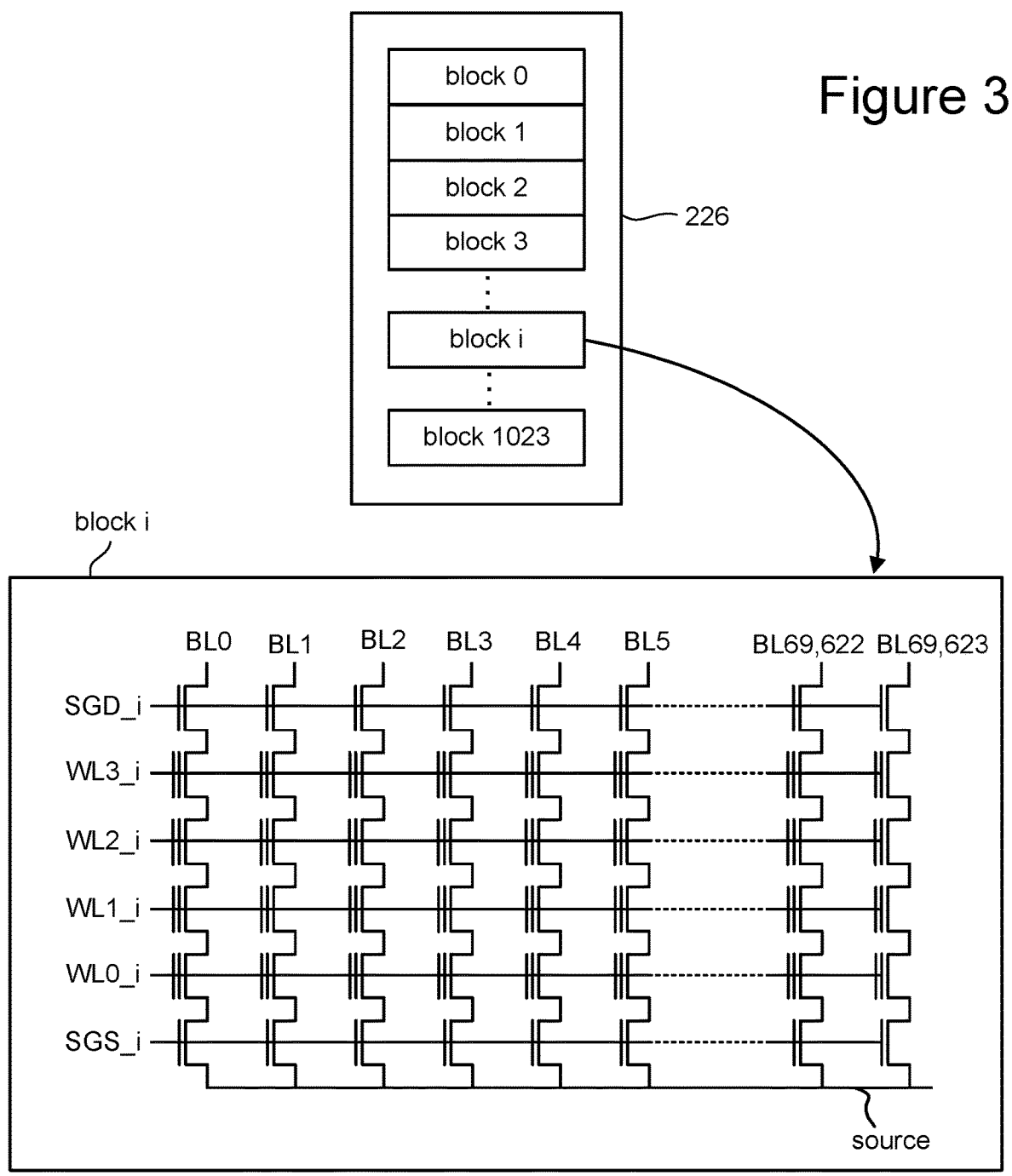
FIG. 3 depicts an example of a structure of memory cell array to illustrate an arrangement of memory cells along word lines and bit line.

FIG. 3 depicts an example of a structure of memory cell array 226 to illustrate an arrangement of memory cells along word lines and bit line. The example of FIG. 3 is for flash NAND type of memory, which can be either a two-dimensional or three-dimensional architecture. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69, 623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming and a unit of reading. The read page and the write page are often taken to be of the same size, but different pages sizes can be used for the different operations. Other units of programming and reading can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Besides NAND flash memory, other memory technologies and architectures, including PCM, MRAM, and others discussed above, can be used for the for the memory structure 226. Generally, however, they will be arranged along bit lines and word lines and/or other control lines. For any of these structures, when the memory cells are being sensed, this is typically done by considering a voltage level or current level on a memory cell's bit line in response to bias levels applied to the memory cell by the word lines and/or other control lines, where the sensing is performed by the Sense Blocks 250.

Figure 4:
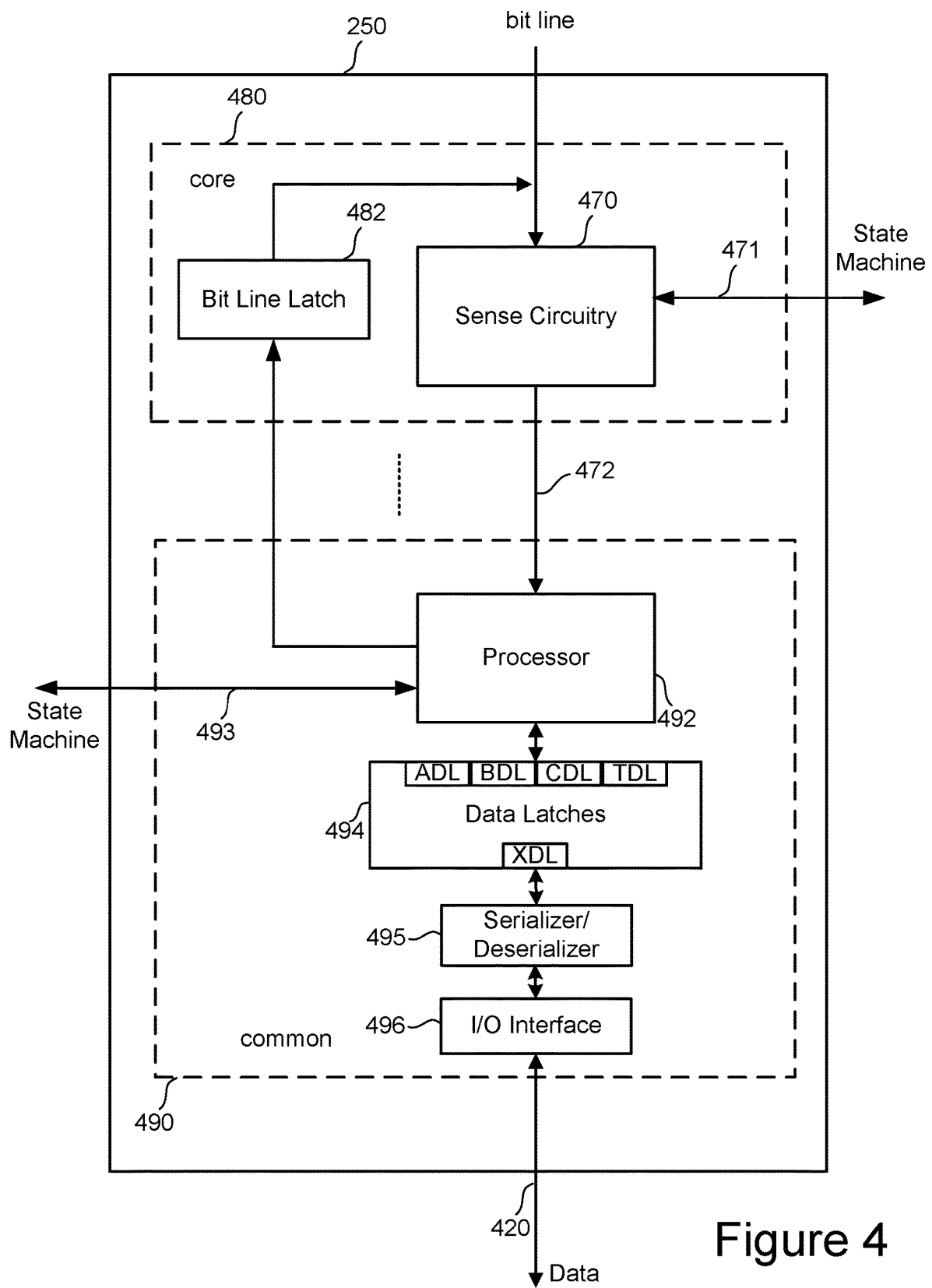
FIG. 4 is a block diagram of an individual sense block partitioned into a core portion and a common portion.

FIG. 4 is a block diagram of an embodiment for an individual sense block 250 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense or sixteen modules 480. Each of the sense modules in a group will communicate with the associated common portion via a data bus 472.

Sense module 480 comprises sense circuitry 470 that determines whether a conduction current in a connected bit line is above or below a predetermined level or, in voltage based sensing, whether a voltage level in a connected bit line is above or below a predetermined level. The sense circuitry 470 is to received control signals from the state machine via input lines 471. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. The input/output circuit of I/O interface 496 provides an interface between data latches 494 and the data bus 420.

During read or sensing, the operation of the system is under the control of state machine 212 that controls (using power control 216) the supply of different control gate or other bias voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

Data latch stack 494 contains a stack of data latches corresponding to the sense module. In one embodiment, there are three, four or another number of data latches per sense module 480. In one embodiment, the latches are each one bit. In this document, the latches in one embodiment of data latch stack 494 will be referred to as XDL, ADL, BDL, and CDL. In the embodiments discussed here, the latch XDL is a transfer latch used to exchange data with the input/output circuit of I/O interface 496. The latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 482 and with the transfer latch XDL, but not directly with the input/output circuit of I/O interface 496, so that a transfer from these latches to the I/O interface is transferred by way of the XDL latches.

In a read or write operation, data is concurrently transferred between the data latches 494 and the memory cells as a page of data, where the read and write page are typically of the same size and can, for example, can correspond to all of the memory cells along a word line. Data is transferred out of (in a read operation) or into (in a write operation) the latches in a parallel transfer operation of several units of data (an 8- or 16-bit word, for example), while the input/output circuit of I/O interface 496 transfers the units of data on and off of the memory die serially. To switch the data between a parallel format and a serial format, a serializer/deserializer circuit 495 is included between the data latches 494 and the I/O interface 496. The serializer/deserializer circuit 495 is discussed in more detail below.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 494 from the data bus 420. During the verify process, Processor 492 monitors the verified memory state relative to the desired memory state.

When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Figure 5:
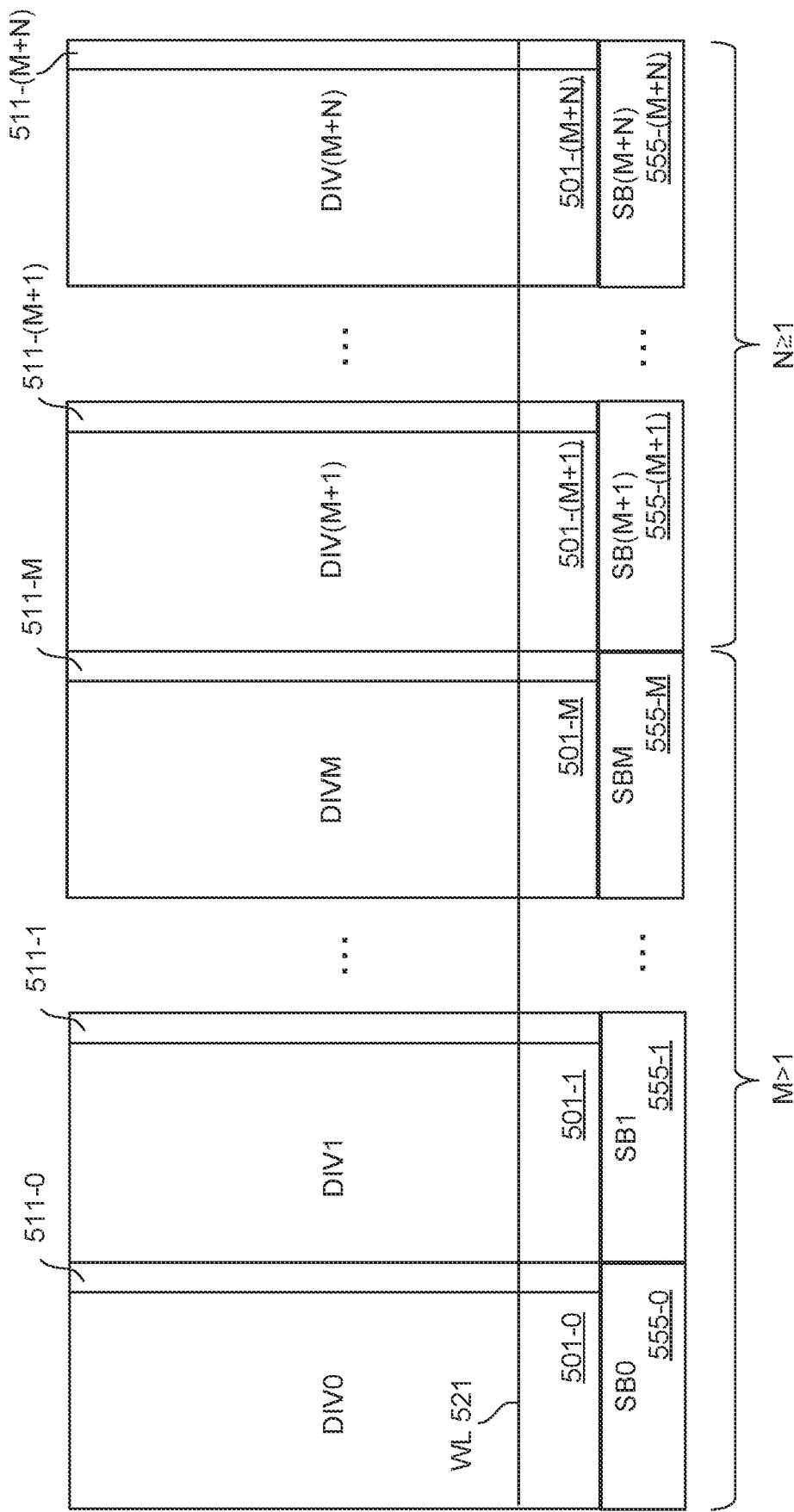
FIG. 5 is a schematic representation of the array of a memory structure sub-divided into a number of divisions.

To increase the degree of parallelism with which data can be transferred on and off of a memory structure 226, the array of the memory structure can arranged as a number of divisions, each of the divisions being a number of contiguous columns of one or more bit lines of the array. For example, where reference to a specific number of bit lines per column is made in following discussion, an embodiment of 16 bit lines per column will be used. To account for defective columns, each division will often have a number of spare columns. Each of the divisions can have corresponding sense block and sets of data latches as described above with respect to FIG. 4, so that a page of data can be transferred on and off of the data latches in parallel. FIG. 5 illustrates an array of memory cells split into divisions.

FIG. 5 is a schematic representation of the array of a memory structure, such as 226 of FIG. 2, sub-divided into a number of divisions. The specific embodiment of FIG. 5 has M+N divisions, where M is an integer greater than one and N is an integer greater than or equal to one. The reason for splitting the divisions into M and N is discussed further below. In much of the discussion below, an example of M=5 and N=2 is used. Each division 501-$i$ can include a number of spare columns 511-$i$ that are here represented as being grouped together to one side of the division, but can be variously distributed according to the embodiment. Each word line, such as shown by the example WL 521, spans all of the columns of the memory structure. Associated with each division 501-$i$ is a sense block SBi 555-$i$ for the sense amplifiers and latches associated with the columns of the division. In one example, a memory array may have a 1000 columns of 16 bit lines each, corresponding to 16K bit lines.

Figure 6:
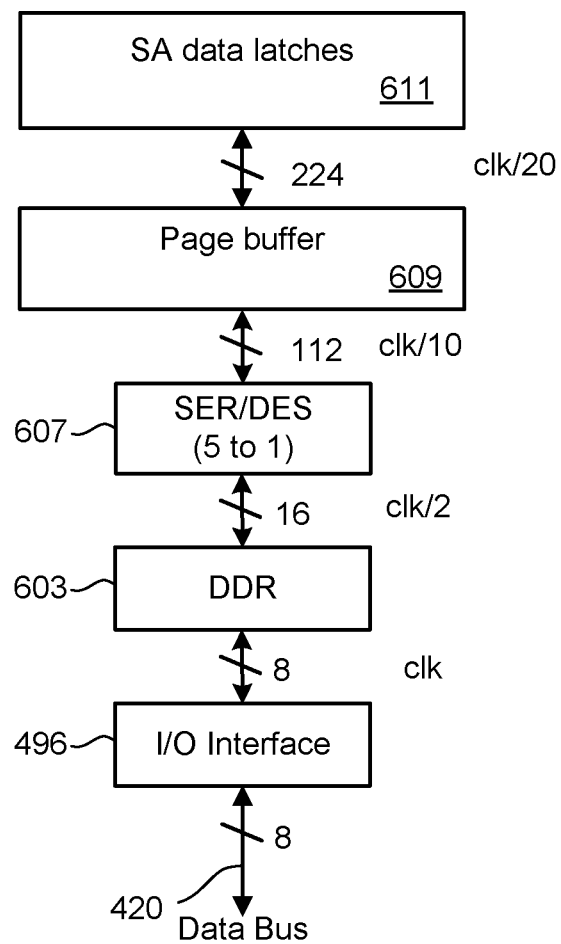
FIG. 6 considers the elements of FIG. 4 between the data latches and the I/O interface in more detail when the memory array is structured as the multiple divisions of FIG. 5.

FIG. 6 considers the elements of FIG. 4 between the data latches 494 and the I/O interface 496 in more detail when the memory structure 226 is structured as the multiple divisions of FIG. 5. In FIG. 5, the input/output circuits of the I/O interface receive data from and transfers data to a data bus 420 serially as a group of m bits. In this example, m=8 so that data is transferred on and off of the memory die one 8-bit word at a time. The performance of a memory die, in terms of a data transfer rate, is based on how quickly data can be passed through the input/output circuits of the I/O interface 496. To increase the transfer rate, the width of the data bus 420 can increased, the clock rate for transferring the data can increase, or both. The width of the data bus is often constrained by design considerations such as the area available on the edges of the integrated circuits of the memory die 200 and the controller 102. The clock rate is constrained by the ability of the other elements of the die to be able to operate at the increased rate.

Referring back to FIG. 4, data latches 494 and the read and write circuitry that use the latches are typically limited to lower clock rates of operation than what the I/O interface 496 can handle. To handle a higher data rate at the data bus 420 while keeping the clock rate at the latches to an acceptable value, the data is converted between the (m bit) serial format at the I/O interface 496 and a parallel format at the data latches 494 by the serializer/deserializer block 495. For data read from the memory array and being transferred off of the memory die, the serializer/deserializer block 495 takes data transferred in parallel off of the latches for each of the memory divisions and converts it into a serial format to transfer off of the memory die; and for data received at the memory die in serial format, the serializer/deserializer block 495 put the data into a parallel format, or "deserializes" the data, for transfer into the latches. FIG. 6 provides more detail on an embodiment for the serializer/deserializer block 495.

Starting at the data bus 420, the memory die transfers m bits of data at a time serially through the input/output circuits of the I/O interface 496 at a clock rate clk. In this example, m=8, but other embodiments can use other values of m. As a first step to slow the data rate down, in some embodiments a double data rate circuit DDR 603 doubles the width of the internal data line from 8 to 16 (or, more generally, m to 2 m), allowing the data to be transferred at a rate of clk/2. In the embodiments described here, the conversion of data between a serial format and a parallel format is performed based on 16 bit sets of data.

In a write operation, the serializer/deserializer circuit SER/DES 605 receivers the data units from DDR 603 in a series format at a serial clock rate of sclk=clk/2 and outputs them in a parallel format. In this embodiment, the level of parallelism is 5, so that data on the parallel bus above SER/DES 605 is now at least five times wider at 80 (or more) bits wide (or, more generally, 10 m or more bits wide) and at a rate reduced by a factor of 5 relative to a parallel clock value of pclk=clk/10, but other embodiments can use differing degrees of parallelism as this is a design choice to balance speed against complexity.

In the embodiment of FIG. 6, SER/DES 605 is connected to an internal parallel data bus YIO. The bus YIO is shown to be 112 bits wide (or 7 times the width of the incoming line of 16 bits). As discussed below, this allows each of the 5 sets of data (each of 16 bits, in this example) transferred in parallel to be selectively be connected to any 5 of 7 groups of data lines. In the read direction this is achieved by a skipping process of some groups of data lines in YIO when putting the 5 sets of data on YIO in parallel format. In the read direction, this is accomplished by use of a 7 to 5 multiplex circuit or, more accurately, five 7 to 1 MUX circuits. The values of 5 and 7 in this embodiment are related to the values of M and N for the number of divisions of the array in FIG. 5 in an embodiment where M=5 and N=2. More generally, although the degree of parallelism is M, when the data is received over the external data bus 420 serially in m bit words, the width of YIO is 2 m(M+N), where the factor of 2 comes about as this embodiment includes the DDR circuit 603.

The introduction of the divisions 501-$i$ into the memory structure 226 as illustrated in FIG. 5, where each division has an associated sense block SBi 555-$i$ for the sense amplifiers and latches, increases parallelism by transferring data on and off of the latches in each of the division in parallel. In the embodiment of FIG. 5, the number of divisions is M+N, where M>1 and N≥1, where the main examples here use M=5 and N=2. The degree of parallelism introduced at SER/DES is M, and the width of YIO is proportional to M+N due to the memory structure 226 having M+N divisions, where the inclusion of the N additional divisions relates to the management of bad columns within the memory structure.

A memory structure 226 will usually have some number of known defective columns that should skipped when accessing the memory array. These columns can be bad either due to defects present when the memory is fresh and determined as part of the test process for a new device, or grown defects acquired once the device is in operation. To maintain the volume of the device's data capacity, a memory array will typically be allotted some number of spare columns 511-$i$ to be used as replacements. The memory device can maintain an inventory of the defective columns, so that when sequentially accessing the columns of the memory structure the bad blocks can be skipped.

When the memory structure 226 is split into divisions 501-$i$ and these divisions are accessed in parallel, the columns in each division are accessed sequentially. If the column being accessed in parallel of one or more of these divisions are defective, the defective columns will not have their latches accessed for the transfer of data. Because of this, at a given access the number of divisions with a set of latches being accessed would vary if all of the divisions are to be accessed every time. For instance, referring to FIG. 5 and considering an embodiment where M=5, taking N=0, and accessing all 5 divisions in every cycle, where there are no bad column in the current cycle, all of the divisions will provide a set of data for 5 sets of data; but if there are 1 or 2 of these divisions are currently at a bad column, this will respectively result in a cycle providing 4 or 3 units of data. As the data rate on the serial side of the SER/DES 605 is fixed, but the number of sets of data on the parallel side would be variable in this sort of arrangement, this could result in a variable cycle rate on the parallel side. Such a variable cycle rate introduces complexity into the system that can become increasingly difficult to manage as clock rates increase. As discussed in more detail below, by having M+N divisions with N≥1, if a group of contiguous divisions being accessed concurrently have a bad column in the current access cycle, the extra N divisions allow an additional one or more contiguous divisions to be accessed in the same cycle to replace the one or more divisions that would have a bad cycle, allowing for M sets of data per cycle to be provided at the parallel bus side of SER/DES 605 even in the presence of bad columns. The introduction of the internal bus YIO with a width to support (M+N) data units allows for the flexibility in the connections between the data latches and SER/DES 605 to omit the divisions that would otherwise have to be skipped. Additionally, by use of the skipping mechanism in the write direction, and use of the multiplexer structure described below in the read direction, any of the M+N divisions can be connected to any of the M parallel data lines connecting to SER/DES 607, allowing an access to begin with any of the M+N divisions without a penalty of some number of cycles.

The skipping of the bad columns can be based on an inventory of bad columns, or column redundancy data (CRD) maintained on the memory die, as represented at CRD 218 of FIG. 2. This bad column information can then be accessed by control circuits connected to the elements of FIG. 6 to skip defective columns. The serial in, parallel out (SIPO) control circuits of the write path, the parallel in, serial out (PISO) control circuits of the read path, and the inventory of bad columns are not shown in the schematic representation of FIG. 6, but will be discussed below for the SIPO and PISO paths.

Above SER/DES 607 is a page buffer 609 to store data received from, or to be transferred to, the data latches in the sense amplifier blocks. Depending on the embodiment, the page buffer 609 can be connected to the transfer latches (the XDL latches of 494 in FIG. 4) in a number of ways. For example, the page buffer 609 can be connected to local data buses for the transfer latches of each division for two different arrays, or planes, so that the number of lines (224 in this embodiment) on the page buffer 609 and the sense amp blocks SA 611 is twice the number of lines (here 112) on the YIO bus. The following discussion focusses on the details on SER/DES 607 and page buffer 609 and their connections.

Figure 7:
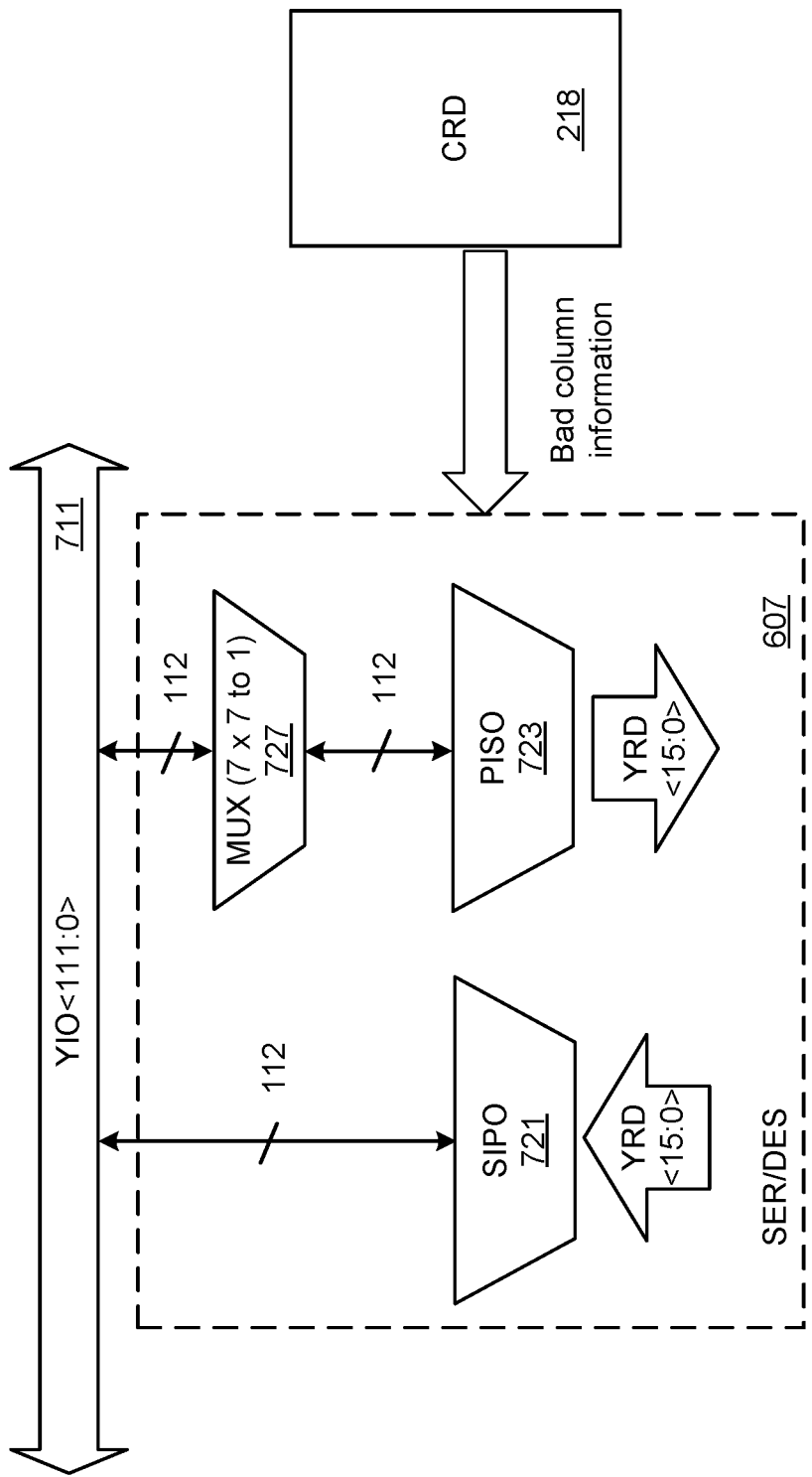
FIG. 7 is an overview of the structure of the serializer/deserializer circuit of FIG. 6.

FIG. 7 is an overview of the structure of SER/DES 605. A serial in, parallel out (SIPO) unit 721 serially receives write data words YWD<15;0>, puts these into parallel form and transfers them onto YIO<111:0>711. Although the width of YIO 711 would indicate a 7 to 1 parallelism, the degree of parallelism in this example is 5 to 1, based on the skipping mechanism described below. The parallel in, series out (PISO) unit 723 receives data in parallel from YIO<111:0>711 and serially reads out read words YRD<15:0>. PISO unit 723 is connected to the internal parallel data bus YIO<111:0>711 through a 7 to 7 multiplex circuit MUX 727, which allows each of the 7 groups of (16, in this example) data lines of YIO<111:0>711 to be selectively be connected any of 7 groups of data lines. As such, the 7 to 7 multiplex circuit 607 can be considered as seven 7 to 1 MUX circuits. The values of this embodiment are related to the values of M and N for the number of divisions of the array in FIG. 5 in an embodiment where M=5 and N=2. More generally, the MUX 727 is a (M+N) to (M+N) to 1 multiplexers, and where the degree of parallelism introduced at SER/DES 605 is (M+N). Although not shown in FIG. 7, one or more buffer or FIFO stages can also be included between SIPO unit 721 and YIO<111:0>711 and between PISO unit 723 and YIO<111:0>711.

A bad column redundancy circuit CRD 218 supplies bad column information to the MUX 727 so that the lines of YIO<111:0> 711 can be selectively connected to the PISO unit 723 to skip over bad columns. The MUX 727 can also be used to selectively align the first word of a sequence with a selected division. The bad column information from CRD 218 is also used by the skipping mechanism of SIPO unit 721. The following looks in more detail at operation of SIPO unit 721 and the column skipping mechanism based on the bad column information from CRD 218, followed by a discussion of the PISO unit 723 and its use of MUX 727 and the information from CRD 218. Although represented as a separate blocks in the discussion here, the CRD 218 can be part of more general control circuitry on the memory die and have its column redundancy data stored along with other system data on the memory die, such as in a fuse ROM.

Figure 8:
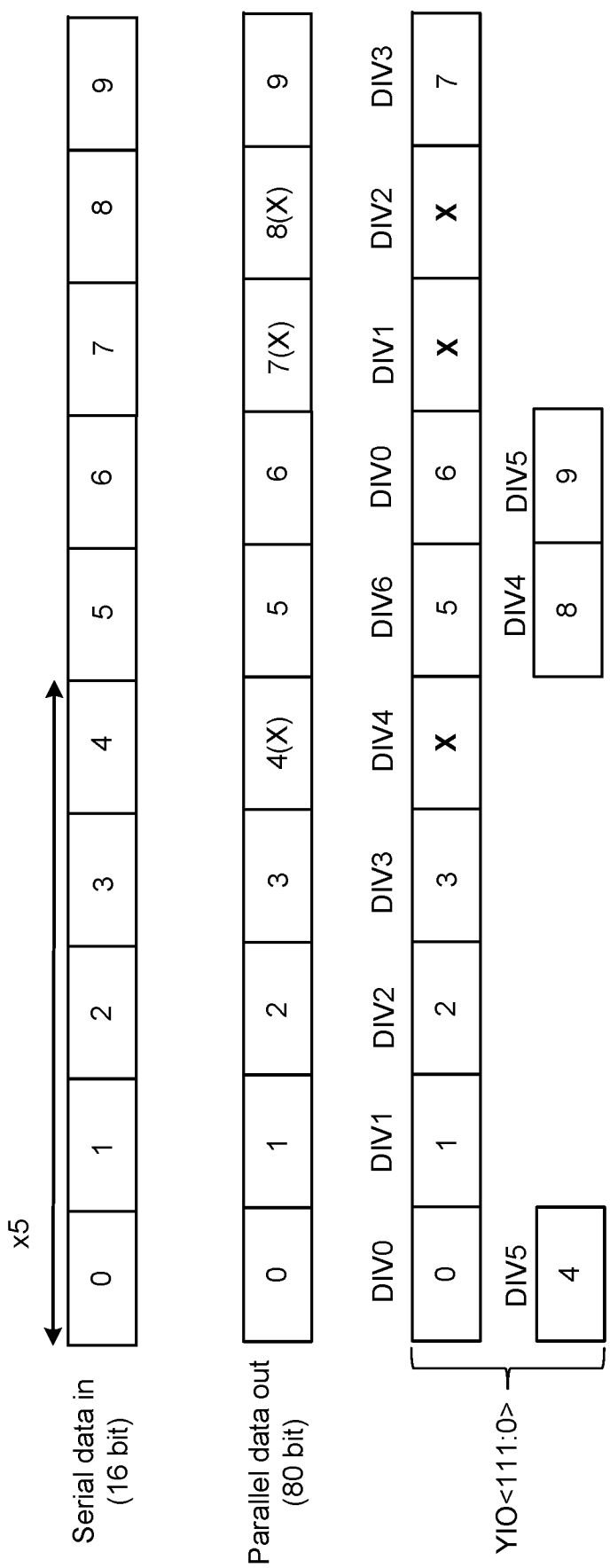
FIG. 8 is a schematic representation of the column skipping process for the serial to parallel data flow in the write direction through the introduction of additional divisions for the memory array.

FIG. 8 is a schematic representation of the column skipping process through the introduction of additional divisions for the memory array in the serial to parallel data flow of the write direction. The example of FIG. 8 is again for an embodiment where M=5 and N=2, so that the serialization/deserialization block can support up to 2 bad columns for every 5 sets of data put into a parallel format. In the embodiment of FIG. 6, where the double data rate block DDR 603 is included between the I/O interface 496 and SER/DES 605, and the data is received from data bus serially m=8 bits at time, the data received at SER/DES 605 is received serially in 16 bit sets of data per serial clock (sclk). This is represented on the top line of FIG. 8 as serial data in, where ten sets of data numbered 0 to 9 are shown. As SER/DES 605 groups the serial data into groups of five (x5) as its level of parallelism is five, the 80 bit output is then transferred at 80 bits of data per parallel clock (pclk=sclk/5) as shown on the second line as parallel data out. Each set of 80 bits of parallel is then transferred to YIO<111:0>, where it can then be transferred into the data latches of one of the divisions and written into a column of 16 bit lines in the corresponding division.

For the example of FIG. 8, assume that the first column of DIV4, the second column of DIV1, and the second column of DIV2 are all bad. Without the column skipping mechanism based on the extra divisions, the data sets 4, 7, and 8 (as indicted by the (x)) would all be transferred to a bad column. By having 7 columns available, the SIPO unit 721 can skip the bad columns when the parallel data are transferred onto YIO<111:0> 711. For data sets 0-4, the SER/DES 607 assigns data sets 0-3 to DIV0-DIV3, but skips the bad column at DIV4 and assigns data set 4 to DIV5. Consequently, the data are assigned to a contiguous, sequential set of divisions, with any bad columns in the sequence skipped. When the next five data sets are transferred, data set 5 is assigned to the next, and last, division DIV 6, after which the assignment loops back around to DIV0 for data set 6. As the next columns for each of DIV1 and DIV2 are bad, these are skipped and data sets 7-9 are assigned to DIV3-DIV5. Consequently, at each cycle a full 5 sets of data can be transferred. Additionally, the first data set of each group of parallel data can be assigned to the next division in the sequence, rather than starting with DIV0 at each transfer.

Figure 9:
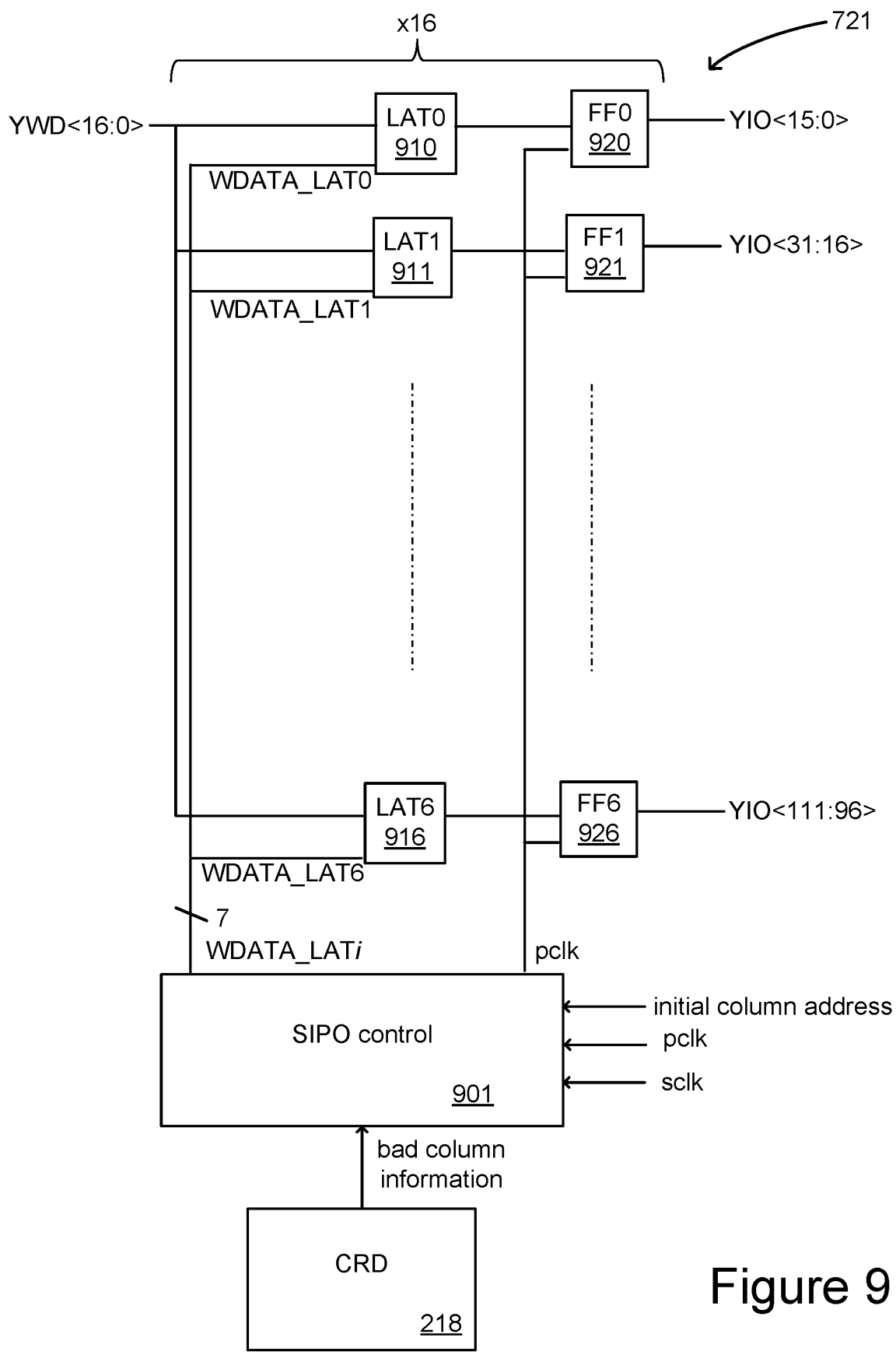
FIG. 9 is block diagram of one embodiment for the circuitry of the serial in, parallel out (SIPO) unit of FIG. 7.

FIG. 9 is block diagram of one embodiment for the circuitry of the SIPO unit 721 of FIG. 7. The serial data on YWD comes in a word at a time (16 bits, in this example) and is loaded into the word wide data flip-flops FF0 920, FF1 921, FF2 922, FF3 923, FF4 924, FF5 925, and FF6 926, from which the write data can be transferred out in parallel according to the clock pclk. The 7 data flip-flops FF0-FF6 920-926 span the 112 bit width of the YIO, but through use of the skipping mechanism only five of these data flip-flops are loaded and transferred at each parallel clock pclk.

In between the incoming serial data on YWD and each of the data flip-flops is one of a set of write data transfer latches LAT0 910, LAT1 911, LAT2 912, LAT3 913, LAT4 914, LAT 5 915, and LAT6 916. Each of the latches LAT0-LAT6 910-916 receives a corresponding signal WDATA_LAT0 to WDATA_LAT6 to enable it to latch the data word on YWD. The incoming write data words can be aligned with any of the latches by starting with the corresponding WDATA_LATi value for LATi and then sequentially enabling the other latches (looping back from LAT6 to LAT0 as needed) by sequentially asserting the corresponding WDATA_LAT signal at the serial clock sclk until 5 write data words have been loaded, after which they can be transferred on to the data flip-flops and on to the corresponding divisions on YIO.

To account for bad columns, in the sequence of latching the data values, if a latch would correspond to a bad column, it is skipped as described above with respect to FIG. 8 by not having its WDATA_LAT signal asserted. For example, if LATi were to correspond to a bad column, after asserting WDATAi-1, WDATAi would not be asserted next, but rather WDATA(i+1) is next asserted (again accounting for wrapping around form LAT6 916 to LAT0 910). Although FIG. 9 shows only 1 latch and one data flip-flop for each YIO output of 16 bits, these latches and flip-flops would each be duplicated 16 times (or, more generally, as many times as the width of the write data words supplied on YWD).

The control signals WDATA_LAT0 to WDATA_LAT6 and pclk are supplied to the latches and data flip-flops by a SIPO control circuit 901. Depending on the embodiment, the SIPO control circuit 901 can be combined with the PISO control circuit discussed below for the PISO process, combined as part of the other on-die control circuits, or as separate circuitry. The SIPO control circuit 901 receives the data on bad columns from CRD 218 and uses this to determine the latches to be skipped when generating the WDATA_LAT signals for the latches. In FIG. 9, the SIPO control circuit 901 is shown to receive both the sclk and pclk clock values, but one or both of these can be generated by the SIPO control circuit 901 itself from a more general clock signal (e.g., clk), depending on the embodiment.

Figure 10:
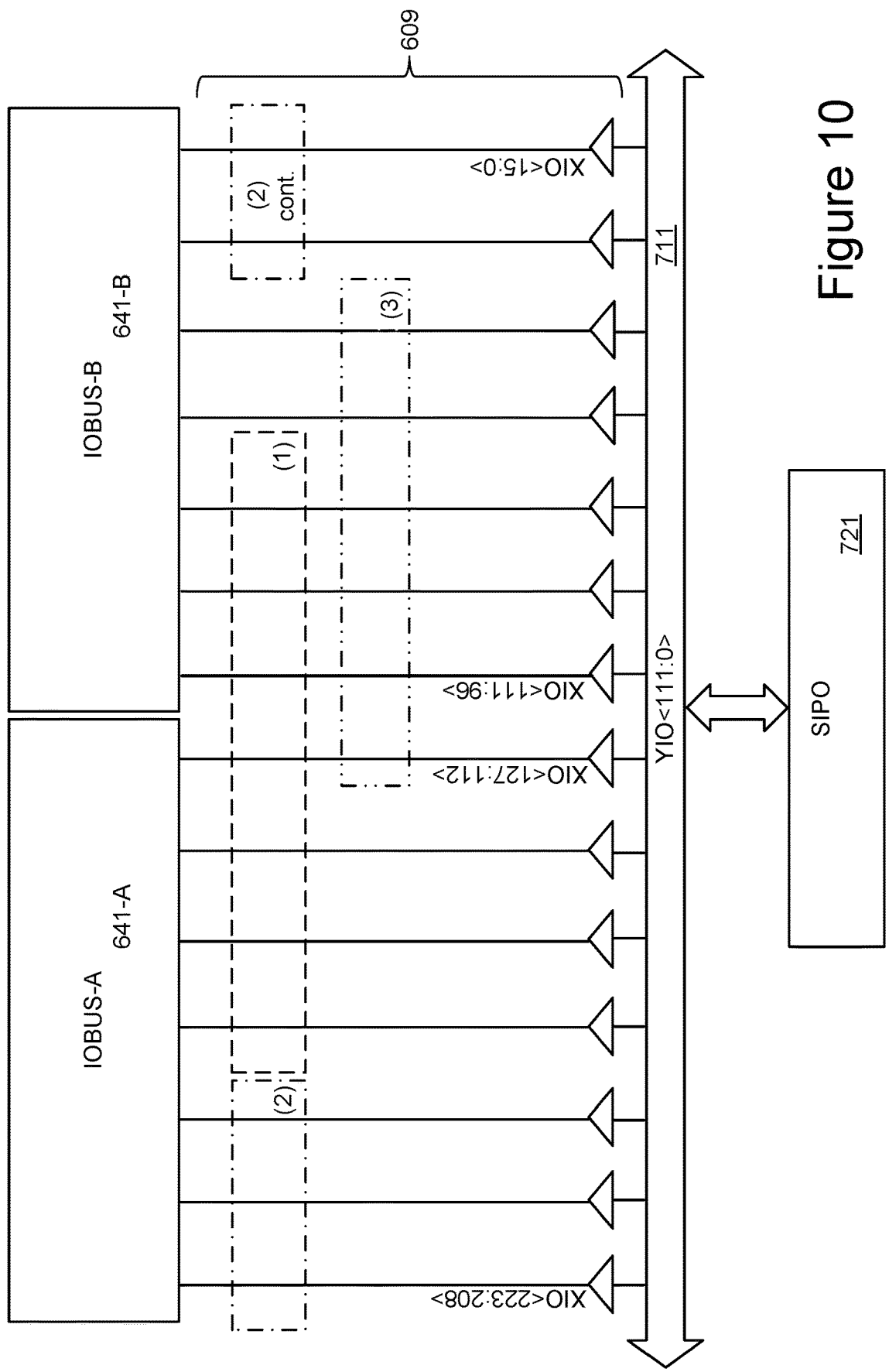
FIG. 10 is a schematic representation of the transfer of parallel data from the serializer/deserializer circuits to the internal data busses supplying the data latches in a data write operation.

FIG. 10 is a schematic representation of the transfer of parallel data from the SIPO portion 721 of the SER/DES 605 to the internal data busses supplying the data latches in a data write operation. As described with respect to FIG. 9, the data flip flops or the SIPO unit 721 are connected to the internal data bus YIO<111:0> 711 so that at each pclk 5 words of data are shifted on to YIO<111:0> 711, starting with a selected division and continuing sequentially across the next four divisions not corresponding to bad columns, where any divisions with bad columns are skipped. The example of FIG. 10 will look at three parallel transfers from the SIPO unit 721, where the first transfer has 2 bad columns, the second transfer has no bad columns, and the third transfer has 1 bad column.

YIO<111:0> 711 connects SER/DES 605 to a page buffer 609. The page buffer 609 is here represented as a series of lines and drivers and connects YIO<111:0> 11 to two different IO busses, IOBUS-A 641-A and IOBUS-B 641-B, that are each 7 columns wide (more generally, M+N columns wide) and connected to the data latches of a corresponding array, or plane, of 7 divisions, as represented in FIG. 5. Consequently, the page buffer 609 is 2×7=14 divisions wide. This allows the clock rate at the data latches of the sense amplifier blocks each of the arrays to be slowed by an additional factor of 2 to further relax the internal cycle time available for the manipulations in the data latch structures.

As discussed above with respect to FIG. 9, the structure of the SIPO 721 circuit allows for the first word of a serially group of received sets of write data to be assigned to any selected column address. For example, the first serial set of data in the parallel set of data in the example of FIG. 10 is assigned to the DIV5. As illustrated by the first parallel transfer marked (1) on the page buffer 609, the transfer starts with column of DIV5 and extends across 7 divisions as it corresponds to 2 bad columns as well as 5 good columns. Position of this window, and the subsequent windows, is decided by the initial column address and will have a size that changes based upon the bad column information, so that window is both sliding and of variable size, the size being 5 divisions plus and the number of divisions that are skipped due to bad columns. This flexible division selection allows all of the YIO bus to be fully utilized based on the initial column address.

After the first parallel transfer (1), a second parallel transfer (2) is made starting at the next division in the sequence. Transfer (2) in this example has no bad columns, so only has five divisions, starting at the next division after transfer (1) and with the window wrapping around back to DIV0. Similarly, parallel transfer (3) starts at the next division and has a window 6 divisions wide as it includes one bad column.

Figure 11:
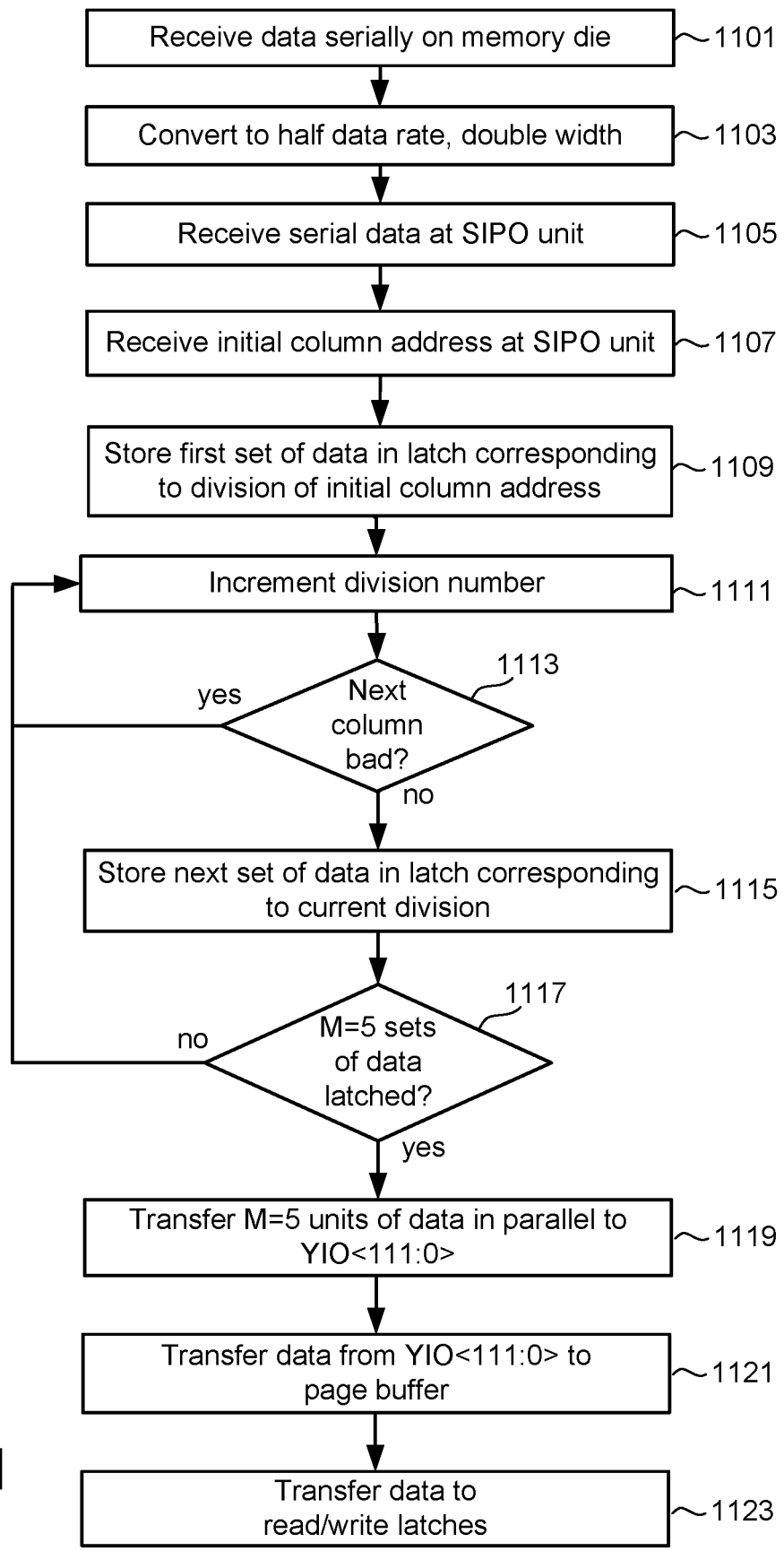
FIG. 11 is a flowchart of one embodiment of the operation of the write data path using the serial in, parallel out circuitry of FIGS. 9 and 10.

FIG. 11 is a flowchart of one embodiment of the operation of the write data path using the serial in, parallel out circuitry of FIGS. 9 and 10. Beginning at step 1101 and referring to FIGS. 6 and 9, m bit units of data, where the m=8 example is being used in this discussion, are received serially from the data bus 420 on the memory die at I/O interface 496. In the embodiment of FIG. 6, the serial data is then transferred from the input/output circuits of the I/O interface 496 to DDR 603, which converts the serial data to a 16 bit wide unit of data at half the clock rate at 1103. Other embodiments may not include the DDR circuit 603 and omit step 1103.

The data units are received at the SIPO at 1105 where, although shown as a single step, this will be a continued series transfer starting from the first unit of data in the series until the transfer stops. The SIPO control circuit 901 receives the initial column address for the serial data at step 1107, where the actual placement of step 1107 can occur at any time prior to the first unit of data being stored in a latch at step 1109.

At step 1109, the first unit of data is stored in the one of the latches LAT0-LAT6 910-916 corresponding to the division to which the column address of step 1107 corresponds, where this is done by the SIPO control circuit 901 asserting the corresponding WDATA_LAT control signal. The rest of the parallel unit of data (5 of the serial units in this embodiment) are then sequentially latched using the serial clock sclk, skipping any divisions that would correspond to bad columns, at steps 1111-1117.

More specifically, at step 1111 the division number is incremented, with the current corresponding column of the division checked to see whether it is bad at step 1113. The determination of whether the column is bad can be made by the SIPO control circuit 901 based upon the bad column information from the CRD unit 218. If the column is bad, the flow loops back to 1111 and the division number is incremented again before going back step 1113. When incrementing the division number at step 1111, as there are 7 divisions in the example, the incrementation is modulo 7, so that when incrementing from DIV6 it will loop back to DIV0. As used herein, when referring to sequentially accessing the divisions, this will be understood to mean sequentially modulo the number of divisions, so that the sequence wraps around from the last of the divisions (DIV(M+N−1)) to the first (DIV0).

In the embodiment here where M=5 and N=2, this allows up to N=2 bad divisions/columns to be skipped for each M=5 units of data. The choice of the value for N is a design decision and for the embodiments presented here, N=2 is considered sufficient for most cases. If the number of bad columns exceeds N, then less than 5 units of data can be transferred in parallel to YIO 711, but with an adjustment in the transfer time for the parallel cycle. Otherwise, for this embodiment up to N bad columns the transfer time is of a fixed rate.

Returning back to step 1113, if the column corresponding to the incremented division is good, the next unit of serial data is then transferred into the latch of the incremented division at step 1115 by the SIPO control circuit 901 by asserting the corresponding WDATA_LAT at the next sclk. Step 1117 determines whether a full set of 5 (or, more generally, M) words or units of data have been loaded into the latches LAT0-LAT6 910-916: if not, the flow loops back to step 1111; and, if so, the data is transferred through the data flip-flops FF0 920, FF1 921, FF2 922, FF3 923, FF4 924, FF5 925, and FF6 926 and on to YIO<111:0> 711 at step 1119. From YIO<111:0> 711, the data is then transferred on to the page buffer 609 at step 1121 and on to the data latches 494 of the sense amp blocks at 1123. FIG. 11 only shows the flow for a single parallel transfer, but the process continues on repeating as the serial data continues to come in, with the data transferred to the data latches 494 of the sense amp blocks at 1123 being programmed as complete pages of data are compiled.

Figure 12:
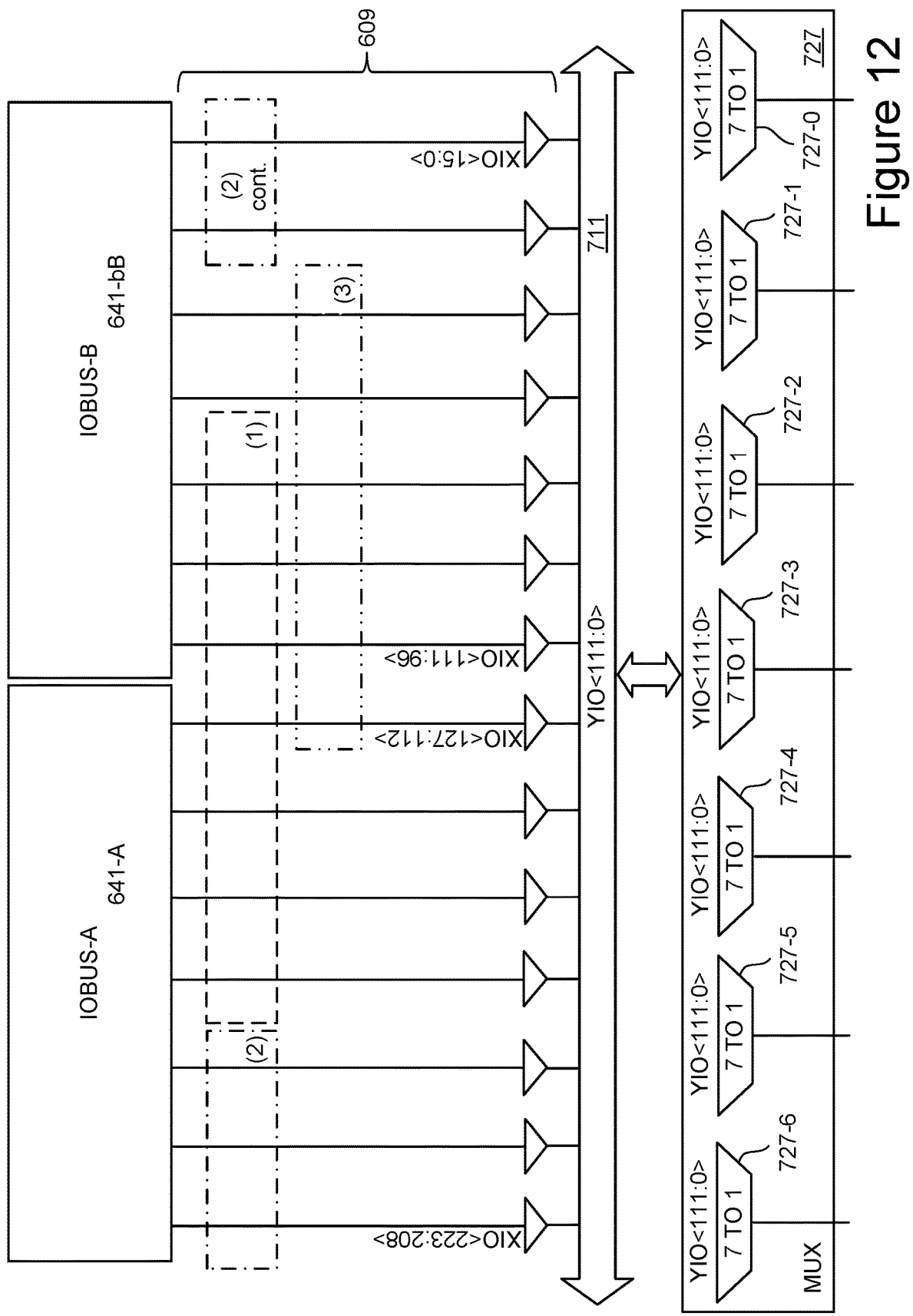
FIG. 12 is a schematic representation of the parallel transfer of data to the multiplexer of the serializer/deserializer circuits from the internal data busses providing read data from the data latches in a data read operation.
Figure 13:
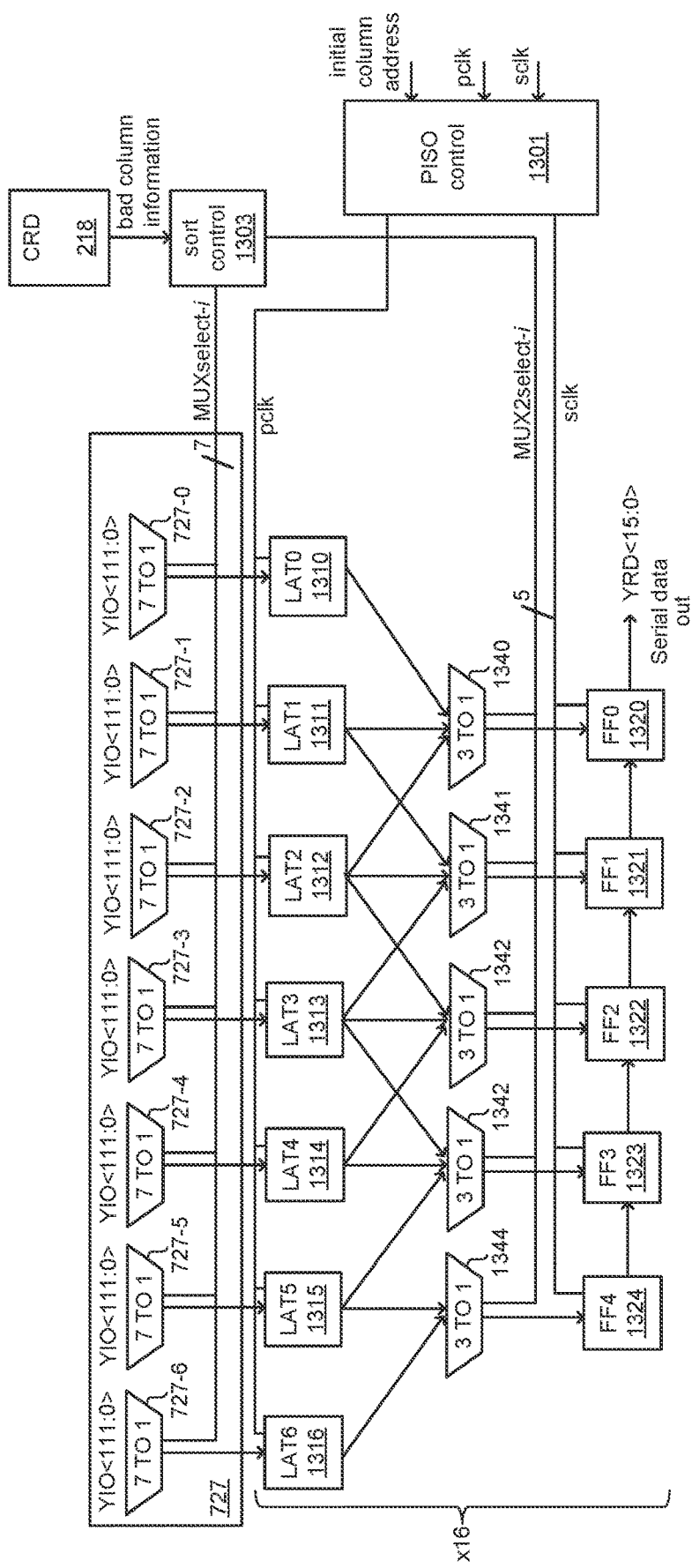
FIG. 13 is block diagram of one embodiment for the circuitry of the parallel in, serial out PISO path of FIG. 7.
Figure 14:
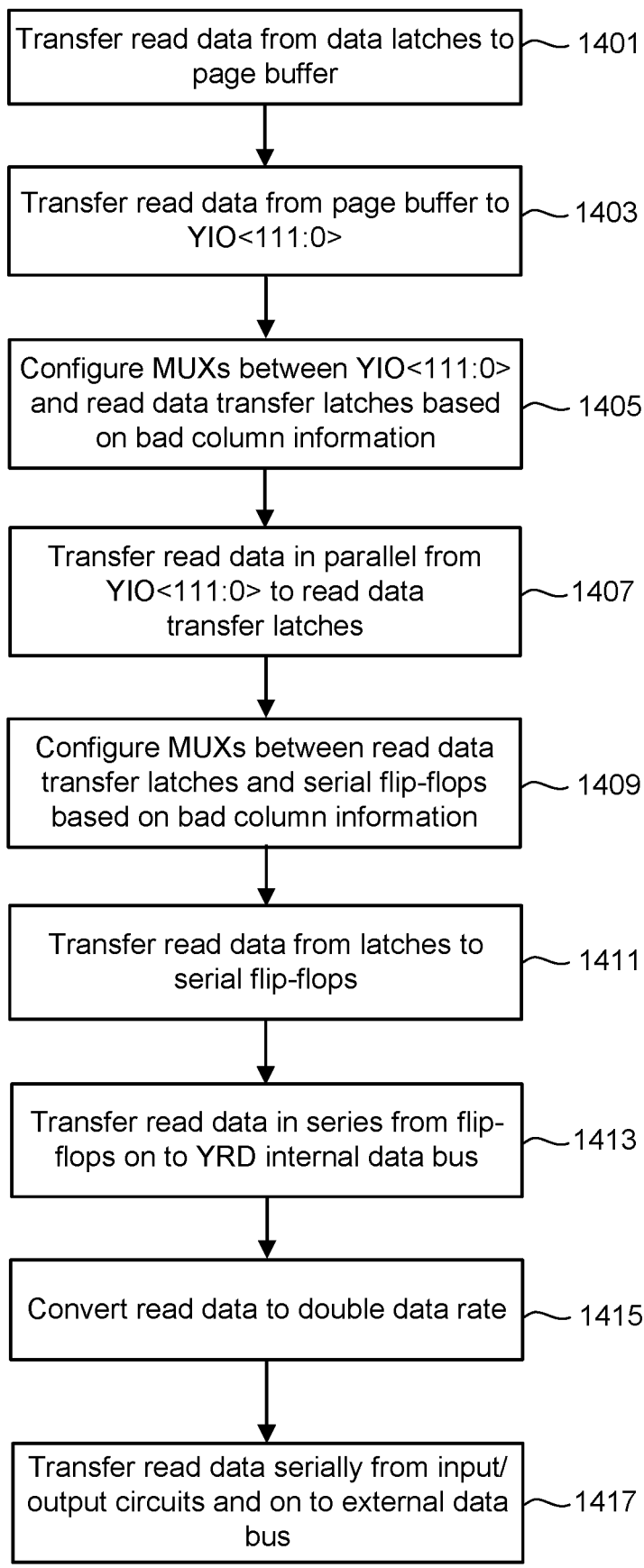
FIG. 14 is a flowchart of one embodiment of the operation of the read data path using the parallel in, serial out circuitry of FIGS. 12 and 13.

FIGS. 12-14 consider the parallel to serial process of the PISO path used in a read operation. Relative to the SIPO path that ran through the SIPO unit 721 to supply write data from the I/O interface 496 to the data latches 494, the PISO path runs through MUX 727 and the PISO unit 723 to supply read data from the data latches 494 to the I/O interface 496.

FIG. 12 a schematic representation of the transfer of parallel data from the internal data busses providing read data from the data latches 494 to MUX 727 in the PISO path of the SER/DES 605 in a data read operation. FIG. 12 is arranged similarly to FIG. 10 and will consider the same three data transfers as in FIG. 10, but where the data is being transferred to the MUX 727 rather than being received from the SIPO unit 721 as in FIG. 10. As before, the first transfer begins with DIV5 and has two bad columns, transfer 2 has no bad columns and transfer 3 has 1 bad column.

FIG. 12 again presents many of the same elements of FIG. 10, with the page buffer 609 again represented as a series of lines and drivers that connects YIO<111:0> 11 to two different IO busses, IOBUS-A 641-A and IOBUS-B 641-B, that are each 7 divisions wide (more generally, M+N divisions wide) and connected to the data latches of a corresponding array, or plane, of 7 divisions, as represented in FIG. 5. Consequently, the page buffer 609 is 2×7=14 columns wide. This allows the clock rate at the data latches of the sense amplifier blocks each of the arrays to be slowed by a further factor of 2 to further relax the internal cycle time available for the manipulations in the data latch structures.

The first transfer of 5 units of data, as shown at (1), begins with a column of DIV5 at XIO<79:64> and extends across 7 divisions as it corresponds to 2 bad columns, as well as 5 good columns. Position of this window, and the subsequent windows, is decided by the initial column address and will change based upon the bad column information, so that window is both sliding and of variable size, the size being 5 divisions plus and divisions that are skipped due to bad columns. This flexible DIV selection allows for all of the internal data bus YIO<111:0> 711 to be utilized. The parallel read unit of data is transferred from page buffer 609 over YIO<111:0> 711 to MUX 727. As described further with respect to FIG. 13, MUX 727 is formed of seven 7 to 1 MUXs 727-0, 727-1, 727-2, 727-3, 727-4, 727-5, and 727-6, each of which is connected to YIO<111:0> 711 so that it can connect a 16 bit unit of data to any of the seven 16 bit divisions of YIO<111:0> 711 to any of the 7 sets of data latches in PISO unit 723. This allows the first word of a data transfer from the data latches to be the first word in the serial output of the PISO unit 723 without any added latency to propagate the first word through the data flip-flops of the PISO unit 723.

Once transfer 1 is shifted from the page buffer 609 to YIO<111:0> 711, transfer 2 starts with the next DIV after transfer 1 and extends for 5 divisions as it has no bad columns, wrapping around from XIO<223:208> to XIO<15:0>. Once transfer 1 has shifted from YIO<111:0> 711 into the SER/DES circuitry 605 and transfer 2 is shifted onto YIO<111:0> 711, transfer 3 is shifted into the page buffer. The widow for transfer 3 is 6 divisions wide as it has one bad column, extending across XIO<111:96> to XIO<127:112>.

FIG. 13 is block diagram of one embodiment for the circuitry of the PISO path of FIG. 7, including MUX 727, the latches and data flip-flops of PISO unit 723, and PISO control circuitry 1301. At the top of FIG. 13 are the seven 7 to 1 MUXs 727-0 to 727-6 also shown at the bottom of FIG. 12. In the more general case of M+N divisions, there would be (M+N) MUXs, each (M+N) to 1 where the units of data in the transfers (16 bits here) would be the width of the YRD bus.

Each MUX 727-*i* has its output connected one of the read data transfer latches LAT0-LAT6 1310-1316 of the PISO unit 723. Each MUX 727-*i* has its input connected to YIO<111:0> 711, so that a unit of read data corresponding to any of divisions on YIO<111:0> 711 can be supplied to any of the latches LAT0-LAT6 1310-1316. In this way, for each data transfer from YIO<111:0> 711 the first unit of data can be transferred to latch 1310, with the other 4 units can be selectively and concurrently transferred to 1311, 1312, 1313, 1314, 1315, and 1316 in order, including skipping for defective columns. So that the units of data of a transfer is aligned with appropriate one of the MUXs 727-0 to 727-6, a sort select 1303 circuit is connected to receive the bad column data from CRD 218. From the bad column data, sort select 1303 can generate the control signals MUXselect-i for each of MUX 727-i to make the appropriate connected for each latch LATi. The control circuits of PISO control 1301 and sort select 1303, along with CRD 218, can be separate circuits as represented in FIG. 13, part of a common circuit, and/or partially or completely incorporated into the more general on-die control circuitry 210.

After being aligned by the MUXs 727-0 to 727-6, the five units of data are shifted from YIO<111:0> 711 through the MUXs 727-0 to 727-6 to LAT0-LAT6 1310-1316 in parallel. Once each of LAT0-LAT6 1310-1316 is loaded, the data is shifted in parallel based on pclk from LAT0-LAT6 1310-1316 to the corresponding one of the serially connected output data latches, or data flip-flops, FF0-FF4 1320-1314. A PISO control 1301 is connected to receive sclk and pclk (or generates these on a move general clock signal) to provide the pclk signal to LAT0-LAT6 1310-1316. To provide the five units of data to the data flip-flops FF0-FF4 1320-1314 from the seven latches LAT0-LAT6 1310-1316, a set of five 3 to MUXs 1340-1344 is connected in between these elements. More specifically, the output of each of MUX 134i has its output connected to FFi 132i, has the three inputs of latches LATi 131i, LATi+1 131i+1, and LATi+2 131i+2, and is connected to sort control 1303 to receive the control signal MUX2select-i. (Although only a single latch and single flip-flop are shown for each of LAT0-LAT6 1310-1316, MUXs 1340-1344, and FF0-FF4 1320-1314, these will be duplicated 16 times to correspond the width of the unit of data used in the serial transfers.) The use of the seven 7 to 1 MUXs 727-0 to 727-6 and the five 3 to 1 MUXs 1340-1344 allow for the first unit of data, or word, of the transfer to be placed into FF0 1320 so that it will be shifted onto YRD<15:0> on the first output cycle of the serial data output. Without this ability, if the intended first word was not from the first division, it would be loaded into a different one of the flip-flops, resulting in a latency of up to 4 cycles of sclk as the first word is propagated through the other flip-flops in the series to FF0 1320.

Once the units of data are shifted in parallel into the flip flops FF0-FF4 1320-1314, the 5 units of data are propagated through FF0-FF4 1320-1314 in series and onto the internal data read bus YRD<15:0> to complete the parallel to series process. Once one set of 5 units of data is moved onto YRD<15:0>, the next set can be shifted onto FF0-FF4 1320-1314 from LAT0-LAT6 1310-1316 at the next pclk.

Considering the more general situation, rather than the specific M=5, N=2 embodiment primarily presented here, the multiplex circuit MUX 727 would include a set of (M+N) M+N to 1 multiplex circuits. The number of data read transfer latches (LAT0 1310, LAT1 1311, . . . ) would be M+N and the number of data flip flops (FF0 1320, FF1 1321, . . . ) would be M. To allow skipping up to N bad columns while transferring M units of data, the multiplexers (1340, 1341, . . . ) between the read data latches and the flip flops would be M (N+1) to 1 multiplexer circuits. In an alternate set of embodiments, the multiplexers (1340, 1341, . . . ) between the read data latches and the flip flops could be eliminated, the number of read data latches could be M, and the multiplex circuit MUX 727 would include a set of M M+N to 1 multiplex circuits.

FIG. 14 is a flowchart of one embodiment of the operation of the read data path using the parallel in, serial out circuitry of FIGS. 12 and 13. FIG. 14 looks at just one transfer of a parallel unit of data from the data latches 494 to the data bus 420, but the process would be executed sequentially for all of the data to be read and transferred off of the memory die. Beginning at step 1401 and referring to FIGS. 6 and 12, data is transferred from the memory latches 494 over IOBUS-A 641-A and IOBUS-B 641-B to the page buffer 609 and, at 1403, from the page buffer YIO<111:0> 711.

Step 1405 sets the MUXs 727-0 to 727-6 based on the MUXselect signals from PISO control 1301 to configure the MUXs so that the 16 bit words from YIO<111:0> 711 are placed on the appropriate one of the latches LAT0-LAT6 1310-1316 when transferred in parallel at step 1407, with the first word of the group of words going to LAT0 1310. At step 1409, the multiplexers (1340, 1341, . . . ) between the read data latches and the flip flops are configured by sort control 1303 so that the M data sets are moved into the correct flip flop, removing any gaps in the read data latches due to bad columns. At step 1411 the words of data are shifted in parallel from latches LAT0-LAT6 1310-1316 through the configured multiplexers 1340-1344 to flip-flops FF0-FF4 1320-1324.

Step 1413 sequentially transfers the read words of data from FF0-FF4 1320-13224 to YRD<15:0>, each word moving up one latch per sclk and, from FF0 1320 onto YRD<15:0>. In the embodiment presented here, where M=5 and N=2, N=2 bad columns can be accommodated for each M=5 serial units of data. If there are more than 2 bad columns in a group of 7 are bad, less than all of FF0-FF4 1320-13224 will be filled and in some embodiments the transfer rate can be adjusted to accommodate the empty flip-flops. Otherwise, for up to N=2 bad columns per set of M=7 words of data, the parallel to serial transfer at a fixed rate. Once the data from FF0-FF4 1320-13224 to YRD<15:0> is transferred on to YRD<15:0> at 1413, at step 1415 it is received at DDR 603 and transferred at a doubled rate, 8 bit bus to the input/output circuitry of the I/O interface 496 and then on to the data bus 420 at step 1417.

As described above, the introduction of additional divisions into the memory structure allows for the serialization/deserialization circuitry in the data path between the input/output circuits and the read and write data latches to transfer data with a fixed rate for the cycle time. By use of the column skip mechanism for the serial in, parallel out circuits in the write path and multiplexing introduced in the parallel in, series out circuits of the path, the bad columns can be avoided while allowing the read and write elements to operate with a relaxed cycle rate while increasing the transfer rate on the data bus to a memory die's I/O interface.

According to a first set of aspects, an apparatus includes an array of non-volatile memory cells formed along a plurality of word lines and a plurality of columns, the columns being divided into a plurality of M+N divisions, each of the divisions formed of a plurality of contiguous columns, wherein the word lines span columns of the array, M is an integer greater than 1, and N is an integer greater than or equal to 1. The apparatus also includes M+N sets of data latches, each set of data latches connectable to the columns of a corresponding one of the M+N divisions and each configured to hold data being transferred between the set of data latches and the corresponding division. An input/output circuit configured to transfer data on and off of the apparatus serially and a serializer/deserializer circuit connected to the input/output circuit and selectively connectable to M of the M+N sets of data latches and configured to transfer data between a selected M sets of the data latches and the input/output circuit. The apparatus further includes one or more control circuits connected to the M+N sets of data latches and the serializer/deserializer circuit, the one or more control circuits configured to transfer data between the input/output circuit and the sets of data latches by converting M sets of data between a serial format and a parallel format by accessing a selected M sets of the M+N sets of data latches concurrently by the serializer/deserializer circuit and to select which of the M sets of data is transferred first when the M sets of data are in a serial format at the input/output circuit.

In additional aspects, a method includes receiving M sets of write data serially, where M is an integer greater than one, and sequentially storing each the M sets of write data in a selected one of M+N write data transfer latches, where N is an integer greater than or equal to one and each of the M+N write data transfer latches corresponds to a division of a memory array of non-volatile memory cells formed along a plurality of columns, the columns being divided into of M+N divisions. The method further includes transferring in parallel the sets or write data stored in the M+N write data transfer latches to M+N sets of data latches, wherein each set of data latches is connectable to the columns of a corresponding one of the M+N divisions.

Further aspects include a method that includes transferring in parallel M sets of read data from M+N sets of data latches, each of the M sets of read data being transferred into a selected one of M+N read data transfer latches, where M is an integer greater than one, N is an integer greater than or equal to one, and each of the M+N sets data latches corresponds to a division of a memory array of non-volatile memory cells formed along a plurality of columns, the columns being divided into of M+N divisions. The method also includes serially transferring the M sets of read data from the read data transfer latches to an input/output circuit of a memory die on which the memory array is formed, and serially transferring the M sets of read data off of the memory die from the input/output circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    an array of non-volatile memory cells formed along a plurality of word lines and a plurality of columns, the columns being divided into a plurality of M+N divisions, each of the M+N divisions formed of a plurality of contiguous columns, wherein the word lines span the columns of the array, M is an integer greater than 1, and N is an integer greater than or equal to 1;
    M+N sets of data latches, each set of data latches connectable to the columns of a corresponding one of the M+N divisions and each configured to hold data being transferred between the set of data latches and the corresponding division;
    an input/output circuit configured to transfer data on and off of the apparatus serially;
    a serializer/deserializer circuit connected to the input/output circuit and selectively connectable to M sets of the M+N sets of data latches and configured to transfer data between a selected M sets of the M+N sets of data latches and the input/output circuit; and
    one or more control circuits connected to the M+N sets of data latches and the serializer/deserializer circuit, the one or more control circuits configured to transfer data between the input/output circuit and the sets of data latches by converting a first M sets of data between a serial format and a parallel format by accessing a first selected M sets of the M+N sets of data latches concurrently by the serializer/deserializer circuit and to select which of the first M sets of data is transferred first when the first M sets of data are in a serial format at the input/output circuit.

2. The apparatus of claim 1, wherein:
    the serializer/deserializer circuit includes a serial in, parallel out section comprising M+N sets of write data transfer latches connected to the input/output circuit and configured to store a selected set of write data in response to a corresponding control signal; and
    the one or more control circuits includes a serial in, parallel out control circuit connected to the M+N sets of write data transfer latches and configured to sequentially store each of a series of M sets of write data in a selected one of the M+N sets of write data transfer latches and subsequently transfer the M sets of write data in parallel to the data latches.

3. The apparatus of claim 2, wherein the serial in, parallel out control circuit is further configured to receive information on defective columns of the array and, in sequentially storing each of the series of M sets of write data in the selected one of the M+N sets of write data transfer latches, to skip sets of write data transfer latches corresponding to a defective column.

4. The apparatus of claim 3, wherein the one or more control circuits are further configured further to maintain an inventory of defective columns and provide the information on defective columns to the serial in, parallel out control circuit.

5. The apparatus of claim 1, wherein the serializer/deserializer circuit includes:
a parallel in, series out section comprising:
M+N sets of read data transfer latches connected to the M+N sets of data latches and configured to store M sets of read data in response to a corresponding control signal, wherein:
the one or more control circuits are connected to the M sets of read data transfer latches and are further configured to store in parallel each of the M sets of read data in a selected one of the M+N sets of read data transfer latches and subsequently transfer the M sets of read data in series to the input/output circuit.

6. The apparatus of claim 5, wherein the parallel in, series out section further comprises:
(M+N) M+N to 1 first multiplexer circuits, each connected between the M+N sets of data latches and a corresponding one of the M+N sets read data transfer latches and configured to selectively connect one of the M+N sets of data latches to the corresponding one of the M+N sets of read data transfer latches, wherein:
the one or more control circuits are connected to the M+N first multiplexer circuits and are further configured to select the one of the M sets of read data connected to a corresponding one of the M+N sets of read data transfer latches by configuring the M+N first multiplexer circuits.

7. The apparatus of claim 6, wherein the one or more control circuits are configured to maintain an inventory of defective columns and access information on defective columns when configuring the first multiplexer circuits.

8. The apparatus of claim 6, the parallel in, series out section further comprising:
M serially connected output data latches; and
M (N+1) to 1 second multiplexer circuits, each connected between N+1 of the M+N sets of read data transfer latches one of the M serially connected output data latches, wherein:
the one or more control circuits are connected to the M sets of read data transfer latches and are further configured to store in parallel each of the M sets of read data in a selected one of the M serially connected output data latches and subsequently transfer the M sets of read data in series from the M serially connected output data latches to the input/output circuit.

9. The apparatus of claim 6, wherein the one or more control circuits are further configured to configure the M+N first multiplexer circuits to transfer a selected one of the M sets of read data to a one of the M+N sets read data transfer latches that is transferred from the parallel in, series out section in a first cycle of transferring the M sets of read data in series to the input/output circuit.

10. The apparatus of claim 5, wherein the one or more control circuits are further configured to transfer a selected one of the M sets of read data in a first cycle of transfer the M sets of read data in series to the input/output circuit.

11. The apparatus of claim 1, wherein the one or more control circuits are further configured to maintain an inventory of defective column addresses and, in converting the M sets of data between a serial format and a parallel format, are further configured to not access sets of the M+N sets of data latches corresponding to a defective column address while maintaining a fixed cycle rate for the converting the M sets of data between a serial format and a parallel format.

12. The apparatus of claim 1, wherein each of the columns comprise a plurality of contiguous bit lines.

13. The apparatus of claim 1, further comprising:
a double data rate circuit connected between the serializer/deserializer circuit and the input/output circuit, the double data rate circuit configured to transfer data between the double data rate circuit and the input/output circuit at a first rate and to transfer data between the double data rate circuit and the serializer/deserializer circuit at a second data rate that is twice the first data rate.

14. The apparatus of claim 1, the first M sets of data corresponding to a first M divisions of a sequence of the divisions in which the divisions with a bad column are skipped and, upon reaching a last of the M+N divisions, the sequence wraps around to a first of the M+N divisions.

15. The apparatus of claim 14, wherein the one or more control circuits are further configured to:
subsequent transferring the first M sets of data, transfer data between the input/output circuit and the sets of data latches by converting a second M sets of data between a serial format and a parallel format by accessing a second selected M sets of the M+N sets of data latches concurrently by the serializer/deserializer circuit, the second M sets of data corresponding to a second M divisions of the sequence beginning with a next division of the sequence subsequent to a last of the sequence of the first M sets of data.

* * * * *